(12) United States Patent
DiTommaso

(10) Patent No.: US 6,271,701 B1
(45) Date of Patent: Aug. 7, 2001

(54) RESETTING FLIP-FLOP STRUCTURES AND METHODS FOR HIGH-RATE TRIGGER GENERATION AND EVENT MONITORING

(75) Inventor: Vincenzo DiTommaso, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/312,141

(22) Filed: May 14, 1999

(51) Int. Cl.$^7$ ....................................................... H03K 5/08
(52) U.S. Cl. ........................ 327/210; 327/211; 327/225; 326/93
(58) Field of Search ..................................... 327/199, 200, 327/201, 207, 208, 210, 211, 212, 223, 225, 218; 326/106–110, 93, 94

(56) References Cited

U.S. PATENT DOCUMENTS

| | | | |
|---|---|---|---|
| 5,017,814 | * | 5/1991 | Lloyd .................................... 327/198 |
| 5,254,888 | * | 10/1993 | Lee et al. ............................... 327/152 |
| 5,315,181 | * | 5/1994 | Schowe .................................. 327/152 |
| 5,537,062 | * | 7/1996 | Mote, Jr. ................................. 326/93 |
| 5,739,703 | * | 4/1998 | Okamura ............................... 326/110 |
| 5,886,582 | * | 3/1999 | Stansell ................................. 327/147 |

OTHER PUBLICATIONS

Computer Engineering Hardware Design, M. Morris Mano, 1988. Chapter 4.*
Floyd, Thomas L., *Digital Fundamentals*, Macmillan Publishing Company, 1994, New York, pp. 381, 382 and 389–392.
Katz, Randy H., *Contemporary Logic Design*, Benjamin/Cummings Publishing Company, 1994, Redwood City, California, pp. 289–299.

* cited by examiner

Primary Examiner—Timothy P. Callahan
Assistant Examiner—An T. Luu
(74) Attorney, Agent, or Firm—Koppel & Jacobs

(57) ABSTRACT

D flip-flop structures are provided which respond to a DATA signal and a clock (CLK) signal by generating an output signal whose state during each clock pulse is that of the DATA signal at that pulse's leading edge and whose state between clock pulses is reset to a selected logic value. Accordingly, these flip-flops can function (e.g., monitor events in the DATA signal or generate sequences of trigger pulses) at the clock rate.

6 Claims, 5 Drawing Sheets

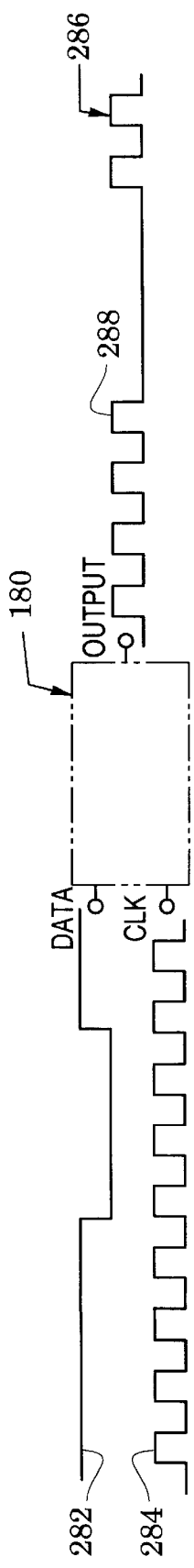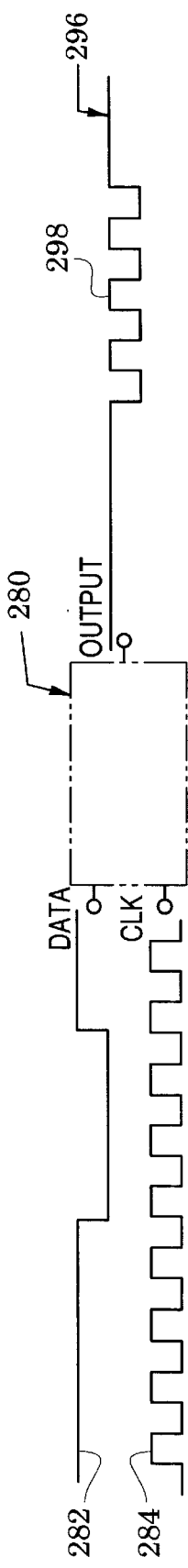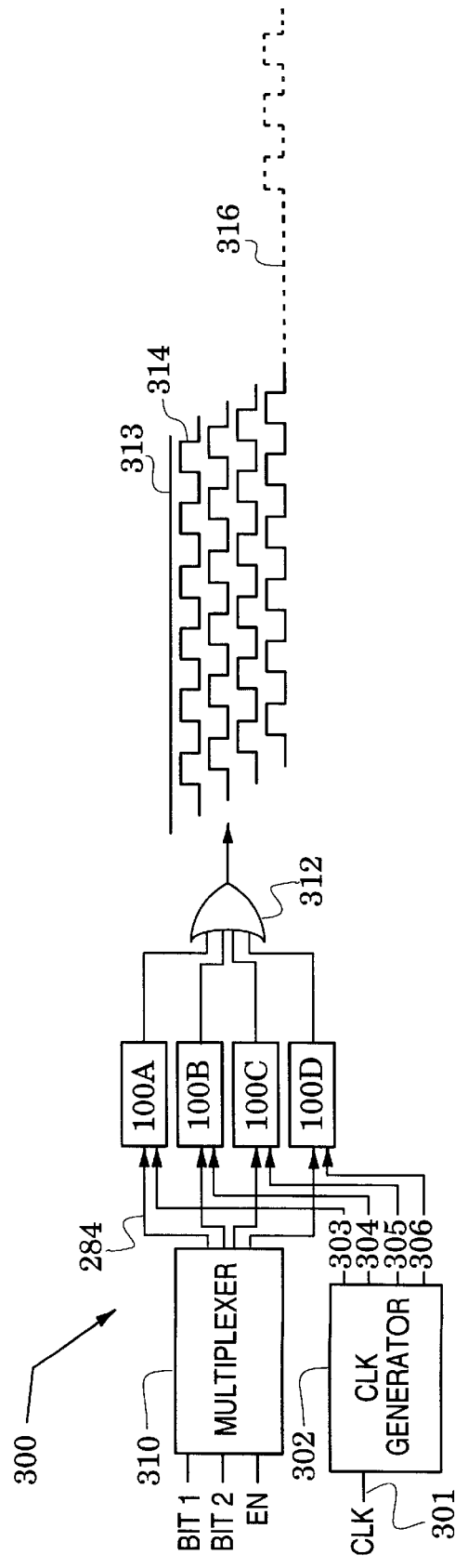

RESETTING FLIP-FLOP STRUCTURES AND METHODS FOR HIGH-RATE TRIGGER GENERATION AND EVENT MONITORING

BACKGROUND OF THE INVENTION

1. Field of the Invention

The present invention relates generally to flip-flop structures.

2. Description of the Related Art

The output of a simple latch (sometimes referred to as an unclocked latch) is continuously responsive to its data inputs. Level-sensitive latches (sometimes referred to as gated latches) also have an enable input (which may be a clock pulse) and these latches continuously sample their inputs while they are enabled. During the enable time period, any input change immediately appears at the latch output. When the enable signal terminates, the last value of the input determines the state held, i.e., "latched", at the latch output.

In contrast, the outputs of flip-flops never have an enable time period in which input state changes are transparently received at the output but, rather, the outputs change to the input states at a clock transition (e.g., the clock's positive edge or the clock's negative edge).

The output signal of a D flip-flop takes on the state of a DATA signal in response to each clock pulse of a clock (CLK) signal. Accordingly, its output signal may be in error because it does not fully respond to events that occur in the DATA signal. The sources of these errors is demonstrated in FIGS. 1 and 2 which respectively show an exemplary D flip-flop 20 and a timing diagram 60 that illustrates waveforms in the flip-flop 20.

In particular, the flip-flop 20 is formed of a series connection of two D latches—a master latch 22 and a slave latch 24. When a CLK signal at a CLK input 26 is in its low state, the master latch 22 receives DATA signals from a DATA input 28 at the S input of an R-S latch 30 and receives an inverted version of the DATA signals at an R input of the R-S latch. The inverted version is formed by an inverter 34.

These inputs reach the R-S latch during the low CLK signal because the CLK input 26 is coupled through an inverter 39 to one input of each of a pair of AND gates 36 and 38 and they are respectively connected to the S and R inputs of the R-S latch 30 and because DATA signals at the DATA input 28 and an inverted version of the DATA signals are respectively connected to other inputs of the AND gates 36 and 38.

The structure of the master latch 22 causes a path 40 to be "transparent" during low portions (the enable state) of a CLK signal at the CLK input 26 and to be latched during high portions of the CLK signal. Thus, DATA signals at the DATA input 28 appear at the Q output 42 of the R-S latch 30 during low CLK portions and are held at this output during high CLK portions.

The slave latch 24 is identical to the master latch 22 with like elements indicated by like reference numbers. However, the AND gates 36 and 38 of this latch receive the CLK signal directly and, accordingly, the slave latch 24 has a path 50 that is "transparent" during high portions of the CLK signal at the CLK input 26 and that is latched during low portions of the CLK signal.

The flip-flop 20 is typically referred to as a pulse-triggered or master-slave flip-flop. FIG. 1 shows an exemplary realization but many others (e.g., with OR gates) are well known. Operation of master-slave flip-flops is described in a variety of references (e.g., Floyd, Thomas L., *Digital Fundamentals*, Macmillan Publishing Company, 1994, New York, pp. 381, 382 and 389–392 and Katz, Randy H., *Contemporary Logic Design*, Benjamin/Cummings Publishing Company, 1994, Redwood City, Calif., pp. 381, 382 and 389–392).

In particular, operation of the flip-flop 20 is illustrated in FIG. 2 which applies a CLK signal 62 and an exemplary DATA waveform 64 to the CLK input 26 and DATA input 28. In response, a MASTER OUTPUT signal 66 appears at the Q output 42 of the master latch 22. Note that the signal 66 is identical to the DATA signal 64 when the CLK signal 62 is low (because the path 40 is "transparent" at this time) but is latched at the leading edges 68 of clock pulses 70. Accordingly, it differs from the DATA signal in waveform portions 72 and 74 of that signal.

In response to the MASTER OUTPUT signal 66, a SLAVE OUTPUT signal 76 appears at the Q output 52 of the flip-flop 20. This signal is identical to the latched MASTER OUTPUT signal 66 when the CLK signal 62 is high (because the path 50 is "transparent" at this time) but is itself latched at trailing edges 78 of the CLK signal 62.

The output signal at the Q output 52 of the flip-flop 20 thus tracks the DATA signal 64 at leading edges 68 of the clock pulses 70 but, as seen in FIG. 2, this output signal can change state only at the leading edges 68. To see why this may introduce errors in the output signal, let it be assumed that the high portions 80, 82, 84 and 86 of the DATA signal 64 represent "events" (e.g., output signals of a device under test) and that it is wished to monitor these events with the flip-flop 20.

In this application, the flip-flop 20 preferably senses the events and reflects that in the SLAVE OUTPUT 76 at the Q output 52. As shown in FIG. 2, however, the SLAVE OUTPUT signal 76 has high portions 90 and 92 that indicate the presence of events 80 and 84 but fails to indicate the presence of events 82 and 86. The use of the flip-flop 20 is therefore limited to applications of event monitoring in which events occur at a rate less than $(\frac{1}{2})f_{CLK}$ wherein $f_{CLK}$ is the clock rate.

Trigger generation is another application in which the flip-flop 20 has limited use. It may be desired, for example, to generate a sequence of trigger pulses when the DATA signal is high and cease generation when it is low. Although the flip-flop 20 can generate such a sequence, the trigger rate is limited to $(\frac{1}{2})f_{CLK}$ because the output of the flip-flop 20 can only change state at each clock pulse's leading edge.

SUMMARY OF THE INVENTION

The present invention is directed to flip-flops that can monitor events and generate sequences of trigger pulses at high rates. In contrast to conventional flip-flops, they reset between clock pulses and, accordingly, they can monitor events that occur as rapidly as the clock rate and can generate trigger pulses at the clock rate.

A flip-flop embodiment of the invention includes a latch and an AND gate wherein the latch has a data input port for reception of a data signal and a clock input port for reception of a clock signal and further has a latch output port for presentation of a latched output signal whose state during each clock pulse is that of the data signal at that pulse's leading edge. When first and second gate input ports are respectively coupled to the latch output port and the clock input port, the flip-flop's output signal is delivered at the gate's output port and, accordingly, the output signal is reset to a selected logic value between clock pulses.

In a method of the invention, a sequence of trigger pulses is generated from a digital data signal and a clock signal of clock pulses that each have a leading edge. The method has a first process in which a leading-edge logic value of the data signal is sensed at each leading edge. For the duration of each clock pulse, the logic value of the data signal is then replaced with the respective leading-edge logic value to thereby form a latched data signal. In a third process step, the latched data signal and the clock signal are anded to generate an output signal. Finally, sequences of trigger pulses are gated into the output signal by alternating the data signal between first and second logic values.

The teachings of the invention can be practiced with various logic circuit structures, e.g., emitter-coupled logic (ECL).

The novel features of the invention are set forth with particularity in the appended claims. The invention will be best understood from the following description when read in conjunction with the accompanying drawings.

BRIEF DESCRIPTION OF THE DRAWINGS

FIGS. 7A and 7B are timing diagrams which illustrate exemplary output signals of the flip-flops of FIGS. 5 and 6; and FIG. 8 is a block diagram of a trigger generator that includes the flip-flop of FIG. 3.

DETAILED DESCRIPTION OF THE PREFERRED EMBODIMENTS

Figure 3:
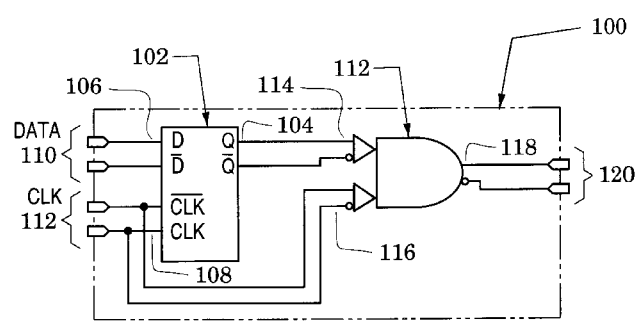
FIG. 3 is a block diagram of a D flip-flop of the present invention.
Figure 4:
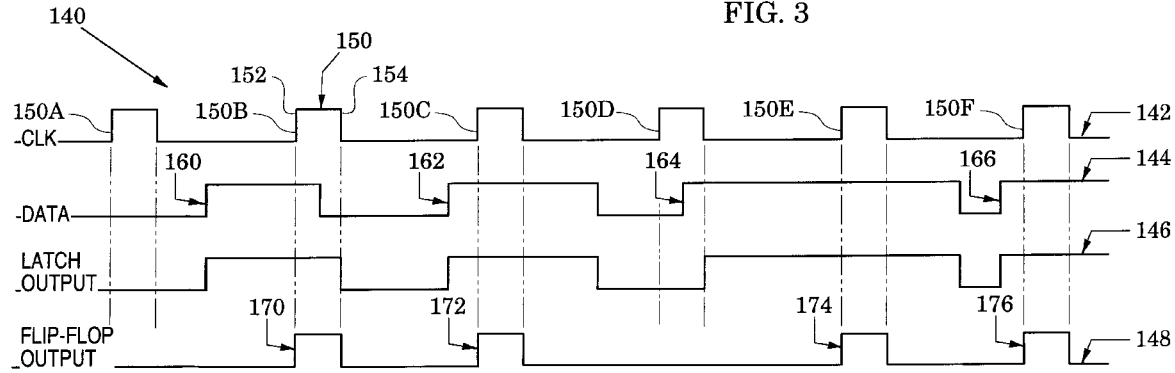
FIG. 4 is a timing diagram which illustrates exemplary waveforms in the flip-flop of FIG. 3.

FIGS. 3 and 4 respectively illustrate a D flip-flop 100 of the present invention and a timing diagram for that flip-flop. The timing diagram exemplifies operation of the flip-flop 20 and explains how it monitors events which occur faster than $(\frac{1}{2})f_{CLK}$ wherein $f_{CLK}$ is the clock rate.

In particular, the D flip-flop 100 has a latch 102 (e.g., a D latch) which has a differential latch output port 104 and also has a differential data input port 106 and a differential clock input port 108 that are respectively coupled to the input ports 110 and 112 of the D flip-flop.

The D flip-flop 100 also has an AND gate 112 which has a first input port 114 coupled to the latch output port 104, a second input port 116 coupled to the input port 112 and an output port 118 that is connected to the output port 120 of the D flip-flop.

In operation of the D flip-flop 100, the latch 102 responds to DATA and CLK signals at its input ports 106 and 108 and generates, at its latch output port 104, a latched output signal whose state during each clock pulse is that of the DATA signal at that pulse's leading edge. In the time region between clock pulses, the last value of the input determines the state held at the latch output port. The AND gate 112 then forms a flip-flop output signal at the output port 120 that is the AND function of the latched output signal and the CLK signal.

This operation is exemplified in the timing diagram 140 of FIG. 4 which shows a CLK signal 142, a DATA signal 144, a latch output signal 146 and a flip-flop output signal 148. The CLK signal has clock pulses 150 with leading edges 152 and trailing edges 154.

Figure 1:
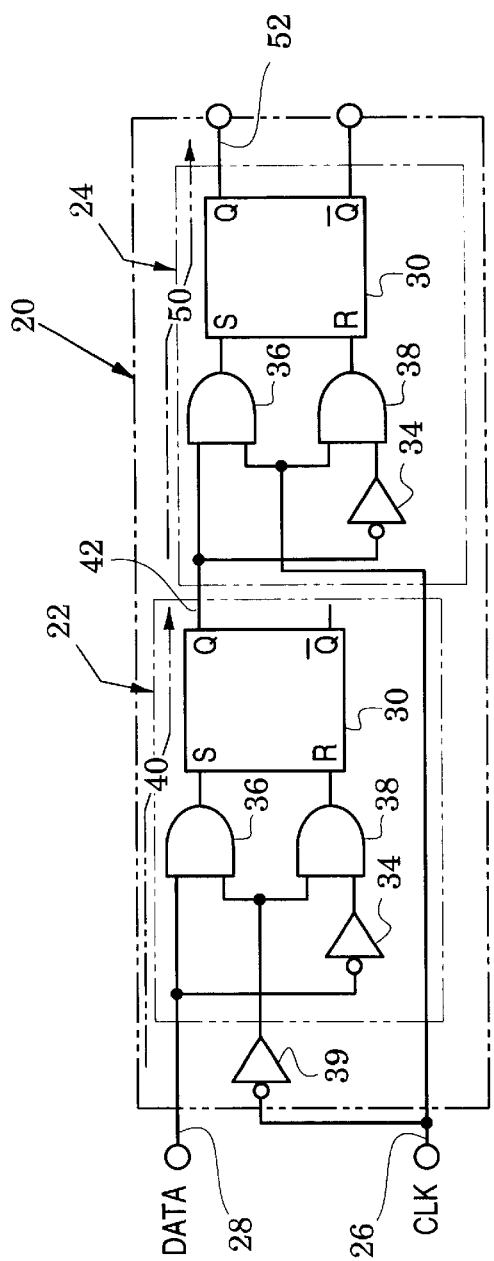
FIG. 1 is a block diagram of a conventional D flip-flop.
Figure 2:
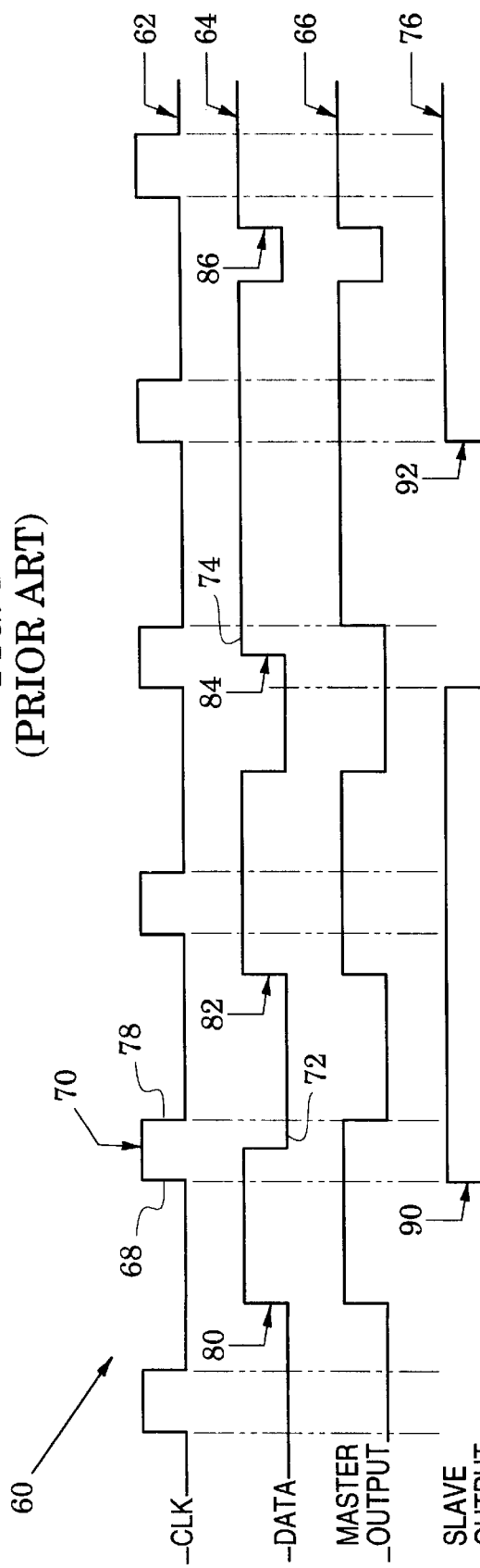
FIG. 2 is a timing diagram which illustrates exemplary waveforms in the flip-flop of FIG. 1.

Similar to FIG. 1, the DATA signal 144 of FIG. 4 has high portions which can represent events 160, 162, 164 and 166. The latch 102 of FIG. 3 is transparent during low portions of the CLK signal 142 and its state during each clock pulse 150 is that of the DATA signal 144 at that clock pulse's leading edge. In other words, the latch 102 is enabled (to follow its input) at all times except at clock pulses 150 where it is latched.

In FIG. 4, the latch output signal 146 (at port 104 of FIG. 3) is accordingly low at clock pulses 150A and 150D, high during clock pulses 150B, 150C, 150E and 150F and is an image of the DATA signal at other times. The flip-flop output signal 148 is the anded function of the CLK signal 142 and the latch output signal 146 and therefore defines pulses 170, 172, 174 and 176 that correspond respectively to events 160, 162, 164 and 166.

The timing diagram 140 illustrates that the flip-flop 100 of FIG. 3 delivers pulses at the $f_{CLK}$ rate whose state is that of the DATA signal at the leading edge of the CLK signal. Because each pulse is reset to zero at the trailing edge of the CLK signal, the flip-flop 20 may also be referred to as a resetting flip-flop.

Figure 5:
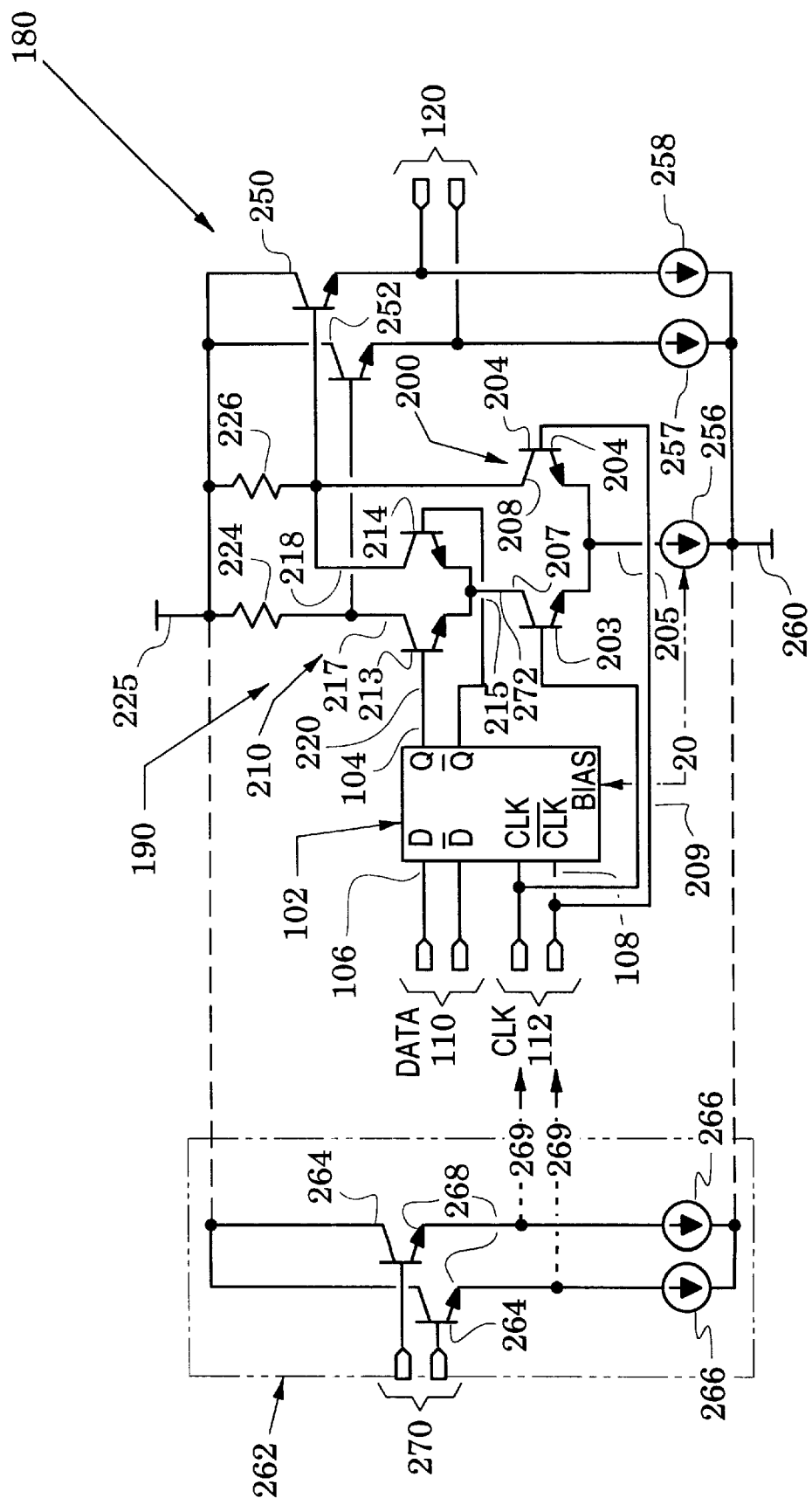
FIGS. 5 and 6 are block diagrams of other flip-flop embodiments of the present invention.

FIG. 5 illustrates another flip-flop embodiment 180 which is similar to the flip-flop 100 with like elements indicated by like reference numbers. In contrast to the flip-flop 100, however, the AND gate 112 is replaced by an AND gate 190 that includes a first differential pair 200 of transistors 203 and 204. This pair has a common port 205 (the pair's common emitters), first and second output ports 207 and 208 (the pair's collectors) and a differential input port 209 (the pair's bases).

The gate 190 also has a second differential pair 210 of transistors 213 and 214 and this pair has a common port 215, first and second output ports 217 and 218 and a differential input port 220. The differential pairs 200 and 210 are arranged with the output port 207 of the first differential pair 200 coupled to the common port 215 of the second differential pair 210.

A first electrical load in the form of a first resistor 224 is coupled between the first output port 217 and a voltage source 225 and a second electrical load in the form of a second resistor 226 is coupled between the voltage source 225 and the second output ports 208 and 218 of respective differential pairs 200 and 210. Buffer stages in the form of emitter followers 250 and 252 are positioned to couple the voltages at the lower ends of resistors 224 and 226 to a gate output port 120.

Current sources 256, 257 and 258 are connected at one end to a voltage source 260 and respectively connected at another end to the common port 205 of the differential pair 200, the emitter of emitter follower 250 and the emitter of emitter follower 252. The gate 180 can be supplemented with a level-shifting circuit 262 so that the DATA and CLK signals operate at the same signal levels. The circuit 262 couples emitter-follower transistors 264 to current sources 266 and connects their emitters 268 to the CLK port 112 as indicated by broken-line arrows 269. The CLK signal is then applied at the differential input port 270 and level shifted by a diode drop.

In operation of the gate 190, the first differential pair 200 steers the current of the source 256 to a path 272 (between the output port 207 and the common port 215) and steers this current to the second resistor 226 in response to respective polarities of a differential input signal at the input port 209. The second differential pair 210 steers the current on the path 272 to the first resistor 224 and steers this current to the second resistor 226 in response to respective polarities of a differential input signal at the input port 220.

In a positive-logic system, it is apparent that the output port 120 will always be a logic value 0 when the CLK signal at input port 209 is a logic value 0 because this input signal causes transistor 204 to steer current to the second resistor 226 thus dropping the voltage at the upper side of the output port 120. In this condition, the logic value at the input port 220 is irrelevant since there is no current on the path 272 to be steered.

The output port 120 will have a logic value 1 only when the signals at the input ports 209 and 220 both have a logic value 1 because only in this case is the current of the current source 256 steered to the first resistor 224 which drops the voltage at the lower side of the output port 120. It is thus apparent that the gate 190 executes the logic function Q=AB in a positive-logic system.

Figure 6:
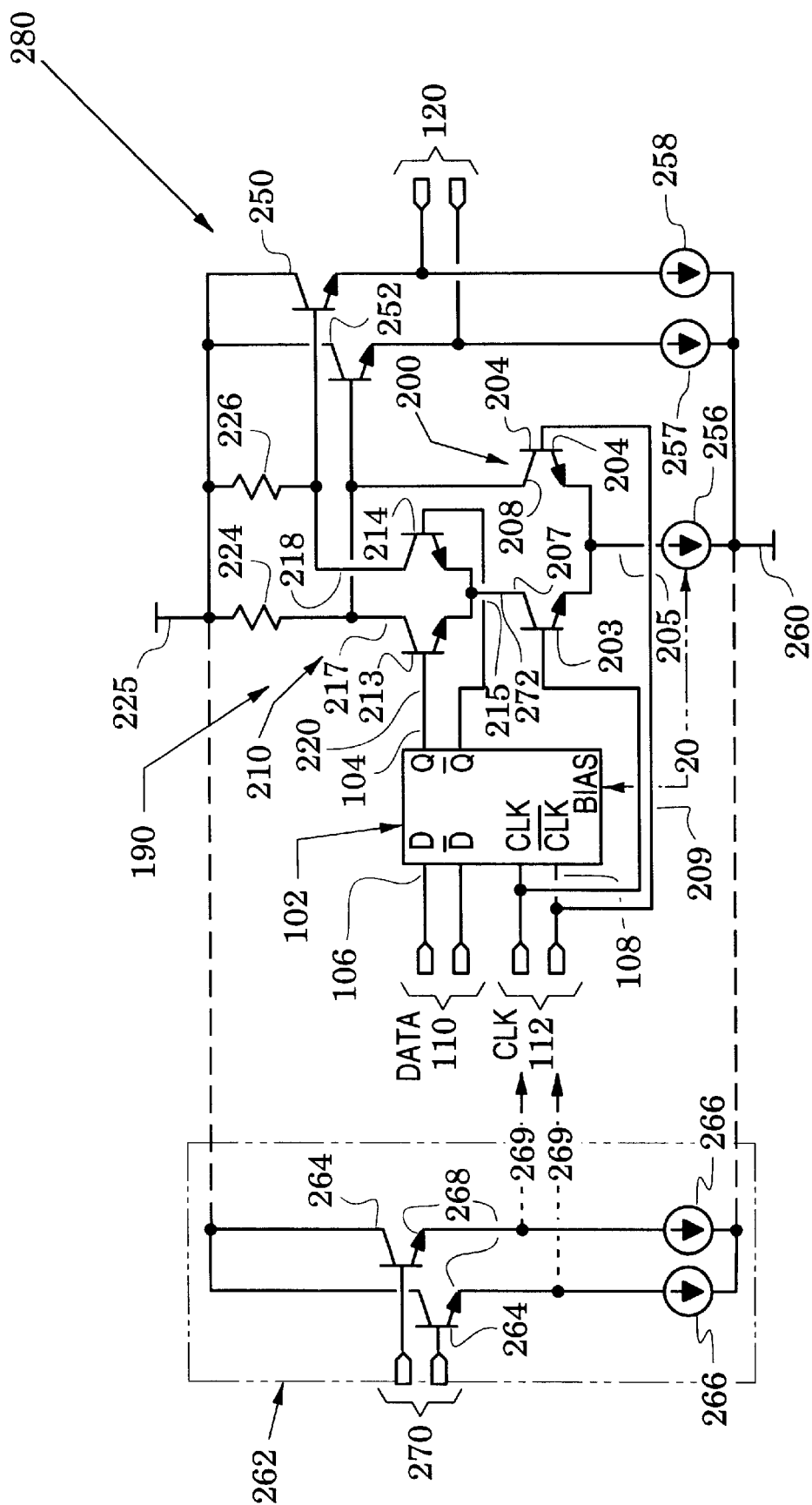

As exemplified in the timing diagram 140 of FIG. 4, the flip-flops 100 and 180 of FIGS. 3 and 5 generate an output signal whose state during each clock pulse is that of the DATA signal at that pulse's leading edge and whose state between clock pulses is reset to the logic value 0. FIG. 6 illustrates a flip-flop 280 which generates an output signal whose state during each clock pulse is the same as that of the flip-flops 100 and 180 but its state between clock pulses is reset to the logic value 1.

Structurally, the flip-flop 280 is similar to the flip-flop 180 with like elements indicated by like reference numbers. However, the second output port 208 of the first differential pair 200 is connected to the first resistor 224 rather than to the second resistor 226.

FIGS. 7A and 7B illustrate the gating of trigger pulses with the flip-flops 100 and 180 of FIGS. 5 and 6. Because it generates an output signal whose state during each clock pulse is that of the DATA signal at that pulse's leading edge and whose state between clock pulses is reset to the logic value 0, the flip-flop 180 responds to a DATA signal 282 and a CLK signal 284 by delivering a sequence 286 of trigger pulses 288 when the DATA signal is in its high state and delivers a low state as long as the DATA signal is in its low state.

In contrast, FIG. 7B shows that the flip-flop 280 responds to the same signals by delivering a sequence 296 of trigger pulses 298 when the DATA signal is in its low state and delivers a high state as long as the DATA signal is in its high state. In the flip-flops 180 and 280, therefore, a sequence of trigger pulses is gated by alternating the data signal 282 between first and second logic states.

FIG. 8 illustrates an exemplary trigger-generator 300 that can be formed with the flip-flop 100 of FIG. 3. In response to a master clock signal 301, a clock generator 302 delivers phase-shifted clock versions 303, 304, 305 and 306 to the CLK ports of flip-flops 10A, 10B, 100C and 100D. In response to bit inputs and an enable signal, a multiplexer 310 places a logic value 1 on the DATA port of any selected one of the flip-flops and logic values 0 on the on the DATA ports of the others. Alternatively, the multiplexer can place a logic value 0 on all of the DATA ports.

The output ports of the flip-flops are fed to an OR gate 312 whose output thereby delivers a logic value 0 as indicated by reference 313 (when a logic value 0 is on all of the DATA ports) or delivers phase-shifted trigger signals 314. By changing the input signals to the multiplexer 310, each of the phase-shifted trigger signals 314 can be gated on and off as indicated by broken lines 316.

Flip-flops of the invention are particularly suited for generating periods of trigger pulses and a method of generating the sequences includes the following exemplary process steps.

In a first process step, a leading-edge logic value of the data signal is sensed at each leading edge. For the duration of each clock pulse, the logic value of the data signal is then replaced with the respective leading-edge logic value to thereby form a latched data signal. In a third process step, the latched data signal and the clock signal are anded to generate an output signal. Finally, sequences of trigger pulses are gated into the output signal by alternating the data signal between first and second logic values.

Flip-flop methods and structures have been shown above for monitoring events and for generating trigger-pulse sequences. These teachings may be practiced with leading and trailing pulse edges regardless of whether either of these is a rising or a falling edge. The teachings of the invention can be realized in various logic circuit structures, e.g., in emitter-coupled logic (ECL). Because flip-flops of the invention reset to a selected logic value in periods between clock pulses, they may also be referred to as resetting flip-flops.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of generating a monitor signal that monitors event pulses in a data signal in response to said data signal and a clock signal which is formed with clock pulses that each have a leading edge, comprising the steps of:

generating a first signal whose state, between said clock pulses, follows the state of said data signal and whose state, during each of said clock pulses, is that of said data signal at that clock pulse's leading edge; and anding said first signal with said clock signal to form said monitor signal with monitor pulses that correspond to said event pulses.

2. A method of monitoring event pulses in a data signal, comprising the steps of:

providing a clock signal that is formed of clock pulses which each have a leading edge;

generating a first signal whose state, during each of said clock pulses, is that of said data signal at that clock pulse's leading edge and whose state, between said clock pulses, follows the state of said data signal; and anding said first signal and said clock signal to realize a monitor signal with monitor pulses that correspond to said event pulses.

3. A method of gating sequences of trigger pulses, comprising the steps of:

providing a clock signal formed of clock pulses which each have a leading edge;

providing a gate signal formed of gate pulses;

generating a first signal whose state, between said clock pulses, follows the state of said gate signal and whose state, during each of said clock pulses, is that of said gate signal at that clock pulse's leading edge; and anding said first signal with said clock signal to form trigger pulses during the presence of each of said gate pulses;

said sequences of trigger pulses thereby gated by said gate pulses.

4. A system for generation of a monitor signal that monitors event pulses in a data signal in response to said data signal and a clock signal which is formed with clock pulses that each have a leading edge, comprising:

a signal generator that generates a first signal whose state, between said clock pulses, follows the state of said data signal and whose state, during each of said clock pulses, is that of said data signal at that clock pulse's leading edge; and a logic gate that ands said first signal with said clock signal to form said monitor signal with monitor pulses that correspond to said event pulses.

5. A system that monitors event pulses in a data signal, comprising:

a clock that provides a clock signal which is formed of clock pulses that each have a leading edge;

a signal generator that generates a first signal whose state, during each of said clock pulses, is that of said data signal at that clock pulse's leading edge and whose state, between said clock pulses, follows the state of said data signal; and a logic gate that ands said first signal and said clock signal to realize a monitor signal with monitor pulses that correspond to said event pulses.

6. A system that gates sequences of trigger pulses, comprising:

a clock that provides a clock signal formed of clock pulses which each have a leading edge;

a gate generator that provides a gate signal formed of gate pulses;

a signal generator that generates a first signal whose state, between said clock pulses, follows the state of said gate signal and whose state, during each of said clock pulses, is that of said gate signal at that clock pulse's leading edge; and a logic gate that ands said first signal with said clock signal to form trigger pulses during the presence of each of said gate pulses;

said sequences of trigger pulses thereby gated by said gate pulses.

* * * * *